(12) United States Patent
Chen et al.

(10) Patent No.: US 7,659,753 B2
(45) Date of Patent: Feb. 9, 2010

(54) ANALOG COMPARATOR WITH PRECISE THRESHOLD CONTROL

(75) Inventors: Lidong Chen, San Jose, CA (US); John K. Wu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/731,711

(22) Filed: Mar. 30, 2007

(65) Prior Publication Data

US 2008/0238493 A1 Oct. 2, 2008

(51) Int. Cl.
*H03K 5/22* (2006.01)
(52) U.S. Cl. .............................. 327/65; 327/67; 327/72
(58) Field of Classification Search .................. 327/65, 327/67
See application file for complete search history.

(56) References Cited

U.S. PATENT DOCUMENTS

| | | | |
|---|---|---|---|
| 5,929,661 A * | 7/1999 | Lee .............................. 327/63 |
| 6,362,467 B1 * | 3/2002 | Bray ....................... 250/214 A |
| 6,504,404 B2 * | 1/2003 | Uchiki et al. .................. 327/65 |
| 6,559,687 B1 * | 5/2003 | Hunt ............................ 327/65 |
| 6,583,661 B1 * | 6/2003 | Tanji et al. ................... 327/355 |

* cited by examiner

*Primary Examiner*—Lincoln Donovan
*Assistant Examiner*—John W Poos
(74) *Attorney, Agent, or Firm*—Ryder, Lu. Mazzeo and Konieczny, LLC; Douglas J. Ryder

(57) ABSTRACT

In general, in one aspect, the disclosure describes an apparatus that included a reference generator to receive a differential input signal and generate reference voltages having same common mode as the differential input signal. A replica bias generator is used to generate a bias signal based on the reference voltages. A comparator is used to compare the input signals to threshold voltages that are based at least in part on the bias signal.

14 Claims, 5 Drawing Sheets

ANALOG COMPARATOR WITH PRECISE THRESHOLD CONTROL

BACKGROUND

Analog comparators are utilized to compare a high-speed differential input signal (e.g., up to 10 Gb/s) to thresholds (e.g., positive and negative) and generate positive or negative signals when the input signal is greater than or less than the positive or negative thresholds respectively. The analog comparators are used as front-end of signal detection circuit and error-generation circuits in high-speed serial link receivers.

FIG. 1 illustrates example input and output waveforms of an analog comparator to demonstrate the functionality thereof. The input is a differential signal ($V_{IN+}$–$V_{IN-}$) that varies over time. The differential signal is compared to a threshold voltage ($V_{TH}$). When the differential signal crosses over (exceeds) a positive threshold voltage ($V_{TH+}$) a positive output signal ($V_{OUT+}$) is generated and when the differential signal crosses over (is less than) a negative threshold voltage ($V_{TH-}$) a negative output signal ($V_{OUT-}$) is generated.

The analog comparator may utilize a common mode logic (CML) amplifier to determine when the differential signal exceeds the threshold voltage. The threshold voltage may be dependent on process, voltage, and temperature (PVT) variations. Any variations in the threshold voltage may affect the detection of the differential signal reaching the thresholds and accordingly may affect the timing and/or occurrence of the output signals. Such variations in output signals may affect applications where a fine signal detection level is required.

BRIEF DESCRIPTION OF THE DRAWINGS

The features and advantages of the various embodiments will become apparent from the following detailed description in which.

DETAILED DESCRIPTION

Figure 1:
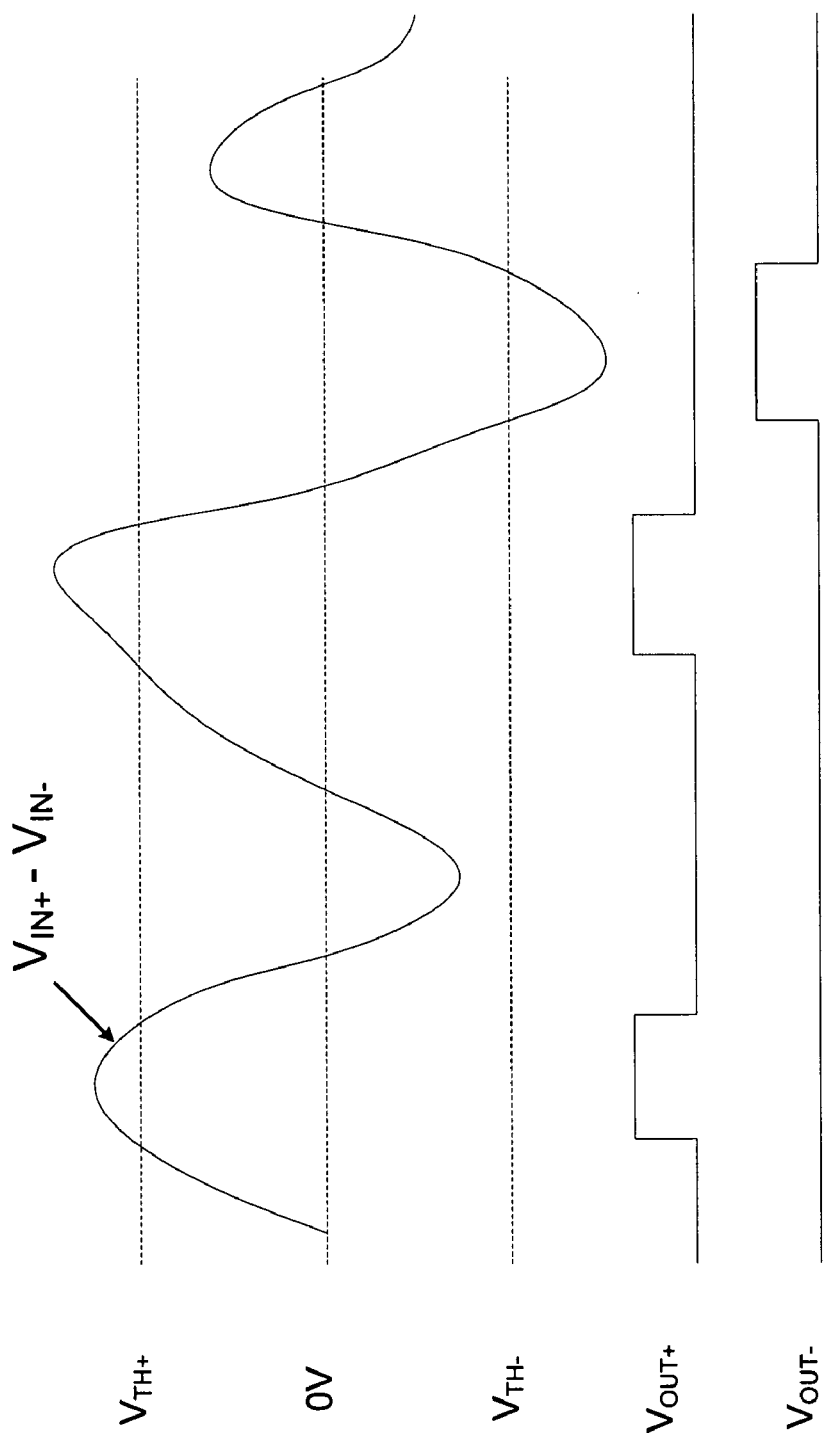
FIG. 1 illustrates example input and output waveforms of an analog comparator, according to one embodiment.
Figure 2:
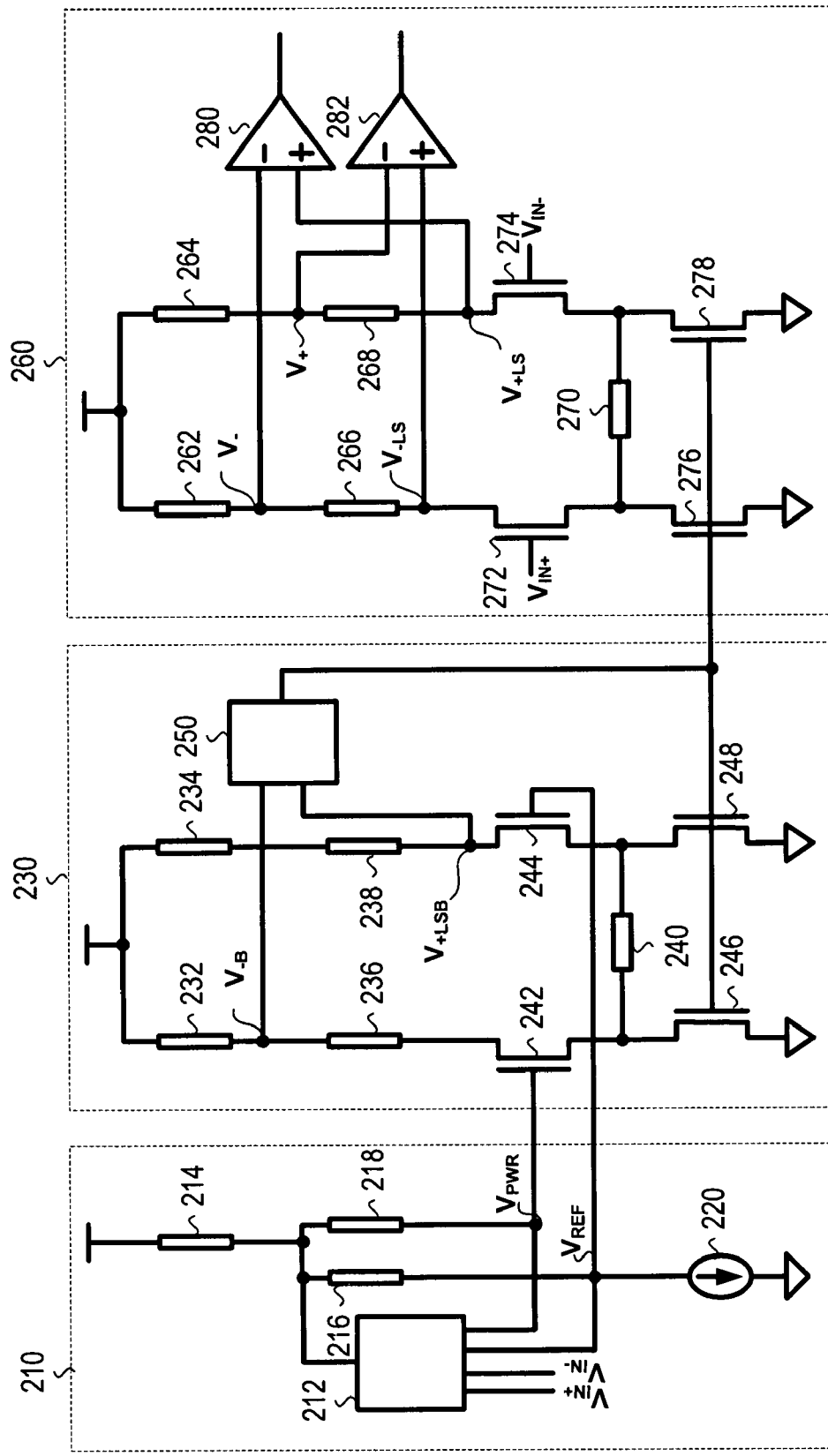
FIG. 2 illustrates an example analog comparator with threshold control that is not PVT sensitive, according to one embodiment.

FIG. 2 illustrates an example analog comparator 200 with threshold control that is not PVT sensitive (is precise). The analog comparator 200 includes a reference generator 210, a replica bias generator 230, and a comparator 260. The reference generator 210 is to generate reference voltages having the same common mode level as the input signals, where the reference voltages are not PVT sensitive. The replica bias generator 230 is to generate a bias signal, where the bias signal is not PVT sensitive. The comparator 260 is to compare the input signals to threshold voltages, where the threshold voltages are not PVT sensitive (are substantially immune to PVT variations). According the analog comparator has precise threshold control.

The reference generator 210 includes a common-mode feed-back loop (CMFB) 212, first, second and third resistors 214, 216, 218, and a current source 220. The reference generator 210 generates single-ended reference voltages ($V_{REF}$ and $V_{PWR}$). The CMFB 212 sets the common-mode level of $V_{REF}$ and $V_{PWR}$ the same as $V_{IN+}$ and $V_{IN-}$. The reference level of $V_{REF}$ and $V_{PWR}$ is proportional to reference current ($I_{REF}$) of the current source 220 times the resistance of the second resistor 216. The $I_{REF}$ generated by the current source 220 is equal to the bandgap voltage of the current source ($V_{BG}$) divided by the master bias resistance of the current source ($R_{MB}$). Since the resistance of the second resister 216 and the master bas resister (not illustrated) in the current source 220 are the same type the resistances cancel out. Accordingly, the reference level of $V_{REF}$ and $V_{PWR}$ is only dependent on the band-gap voltage which is not PVT sensitive.

The replica bias generator 230 includes a replica comparator and a servo loop. The replica comparator includes first through fifth resistors 232-240, and first through fourth transistors 242-248. The servo loop is an operational-transconductance-amplifier (OTA) 250. The $V_{REF}$ and $V_{PWR}$ are provided to the first and second transistors 242, 244. The outputs of the comparator, the negative biased voltage ($V_{-B}$) and the positive level shifted biased voltage ($V_{+LSB}$) are provided to the OTA 250 which generates a bias current based thereon. The OTA 250 is a high gain amplifier and the high gain causes a virtual short of the $V_{-B}$ and the $V_{+LSB}$ output nodes of the replica comparator. The virtual short forces the threshold of the replica comparator to be the difference in the inputs, $V_{PWR}$–$V_{REF}$. As noted above with respect to the reference generator 210 these values are only dependant on the band-gap voltage which is not PVT sensitive.

The comparator 260 includes first through fifth resistors 262-270, first through fourth transistors 272-278, and first and second amplifiers 280, 282. The third and fourth transistors 276, 278 receive the biased voltage ($V_{BIAS}$) output from the replica bias generator 230. The first and second transistors 272, 274 receive $V_{IN+}$ and $V_{IN-}$ respectively. The first amplifier 280 compares the negative voltage ($V_-$) and the positive level shifted voltage ($V_{+LS}$) and generates the positive voltage output ($V_{OUT+}$) if the threshold is exceeded. The second amplifier 282 compares the positive voltage ($V_+$) and the negative level shifted voltage ($V_{-LS}$) and generates the negative voltage output ($V_{OUT-}$) if the threshold is exceeded.

Figure 3:
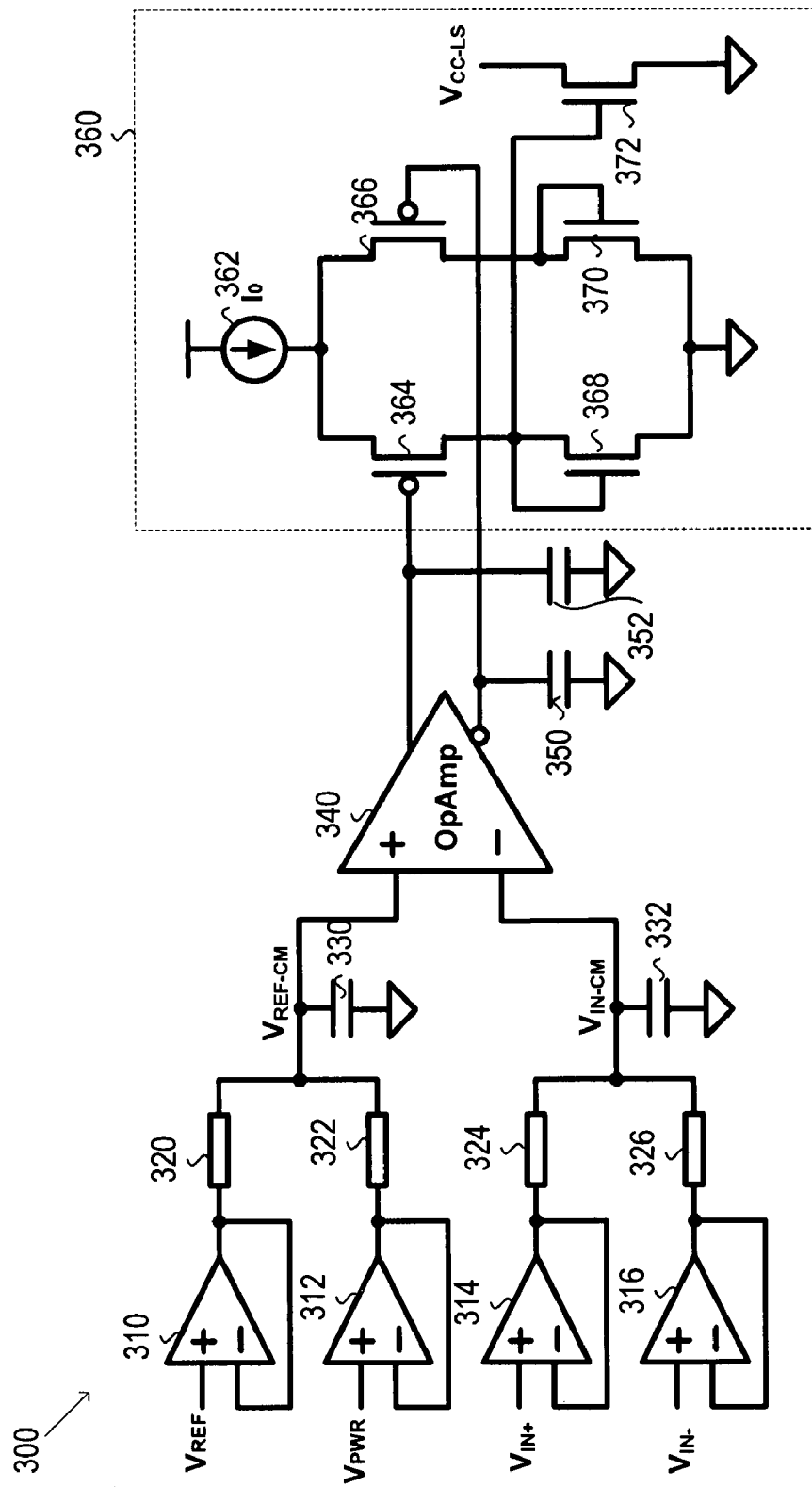
FIG. 3 illustrates an example common-mode feed-back loop (CMFB), according to one embodiment.

FIG. 3 illustrates an example CMFB 300 (e.g., 212 of FIG. 2). The CMFB 300 includes first through fourth unity gain amplifiers 310-316, first through fourth resisters 320-326, first and second capacitors 330, 332, operational amplifier (OpAmp) 340, third and fourth capacitors 350, 352, and a transconductance-amplifier 360. The transconductance-amplifier 360 includes a current source 362, and first through fifth transistors 364-372.

Reference voltages $V_{REF}$/$V_{PWR}$ and input signals $V_{IN+}$/$V_{IN-}$ are buffered through the unity-gain amplifiers 310-316 and resistors 320-326 respectively. The first and second resistors 320, 322 are shorted to generate a common-mode voltage for the reference voltages ($V_{REF-CM}$), and the third and fourth resistors 324, 326 are shorted to generate common-mode voltage for input signals ($V_{IN-CM}$). The two common-mode voltages are fed into the OpAmp 340 and the output of the OpAmp 340 controls the operation of the transconductance-amplifier 360 and the current flowing through the fifth transistor 372. The third and fourth capacitors 350, 352 should be large enough so that the gates of the first and second transistors 364, 366 form the first pole of the loop with enough phase margin. The high gain of the OpAmp 340 forces $V_{REF-CM}$ and $V_{IN-CM}$ to be the same.

Figure 4:
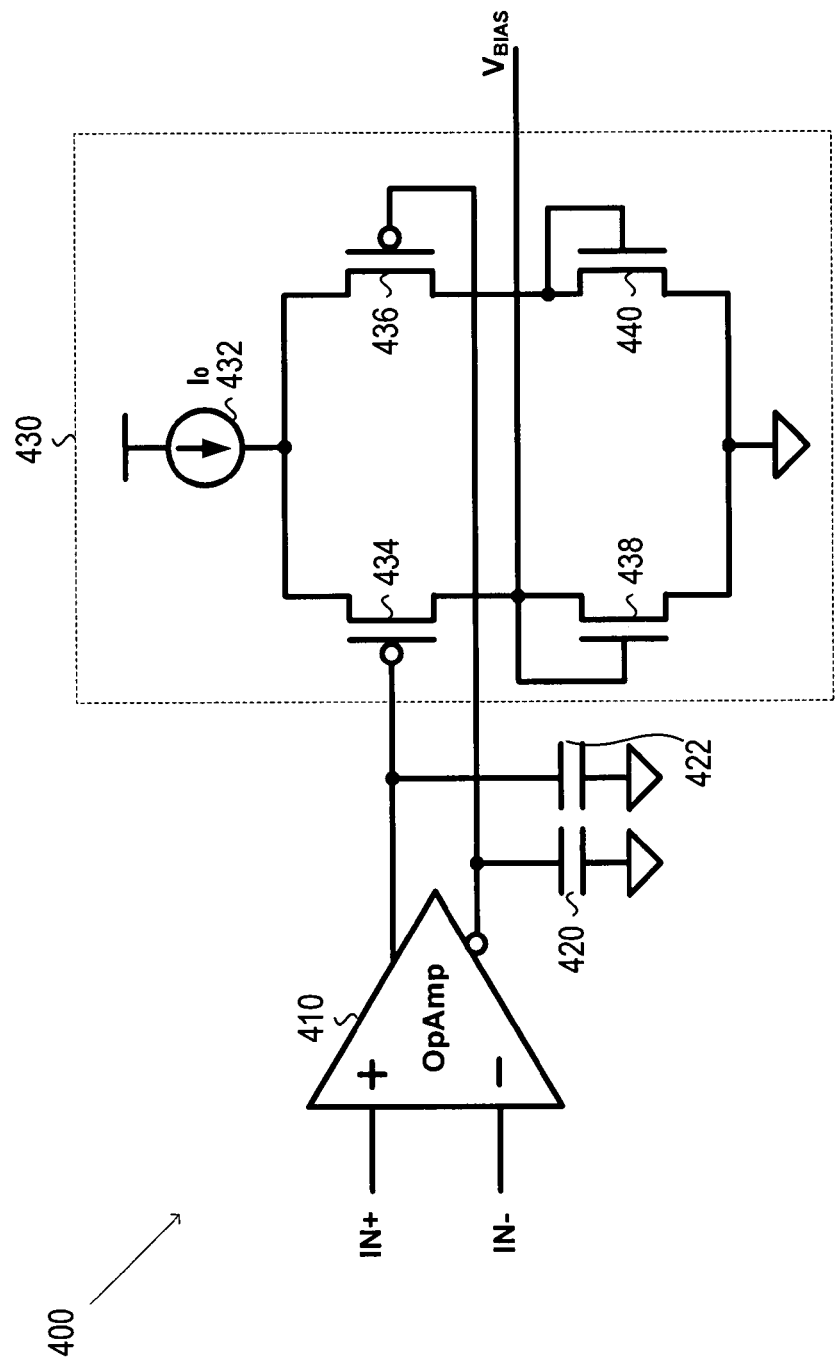
FIG. 4 illustrates an example operational-transconductance-amplifier (OTA), according to one embodiment.

FIG. 4 illustrates an example OTA 400 (e.g., 250 of FIG. 2) schematic. The OTA 400 includes an OpAmp 410, first and second capacitors 420, 422, and a transconductance-amplifier 430. The transconductance-amplifier 430 includes a current source 432, and first through fourth transistors 434-440. Differential inputs (IN+ and IN−) are fed into the OpAmp 410 and the output of the OpAmp 410 controls the operation of the transconductance-amplifier 430 and the voltage bias ($V_{BIAS}$) generated. The first and second capacitors 420, 422 should be large enough so that the gates of the first and second transistors 434, 436 form the first pole of the loop with enough phase margin. The high gain of the OpAmp 410 forces the differential inputs to be the same (to short $V_{-B}$ and $V_{+LSB}$ in FIG. 2).

An analog comparator with precise threshold control (e.g., 200) may be utilized in any number of I/O systems, including high-speed systems. The analog comparator with precise threshold control may be implemented in any number of integrated circuits utilized in these systems.

Figure 5:
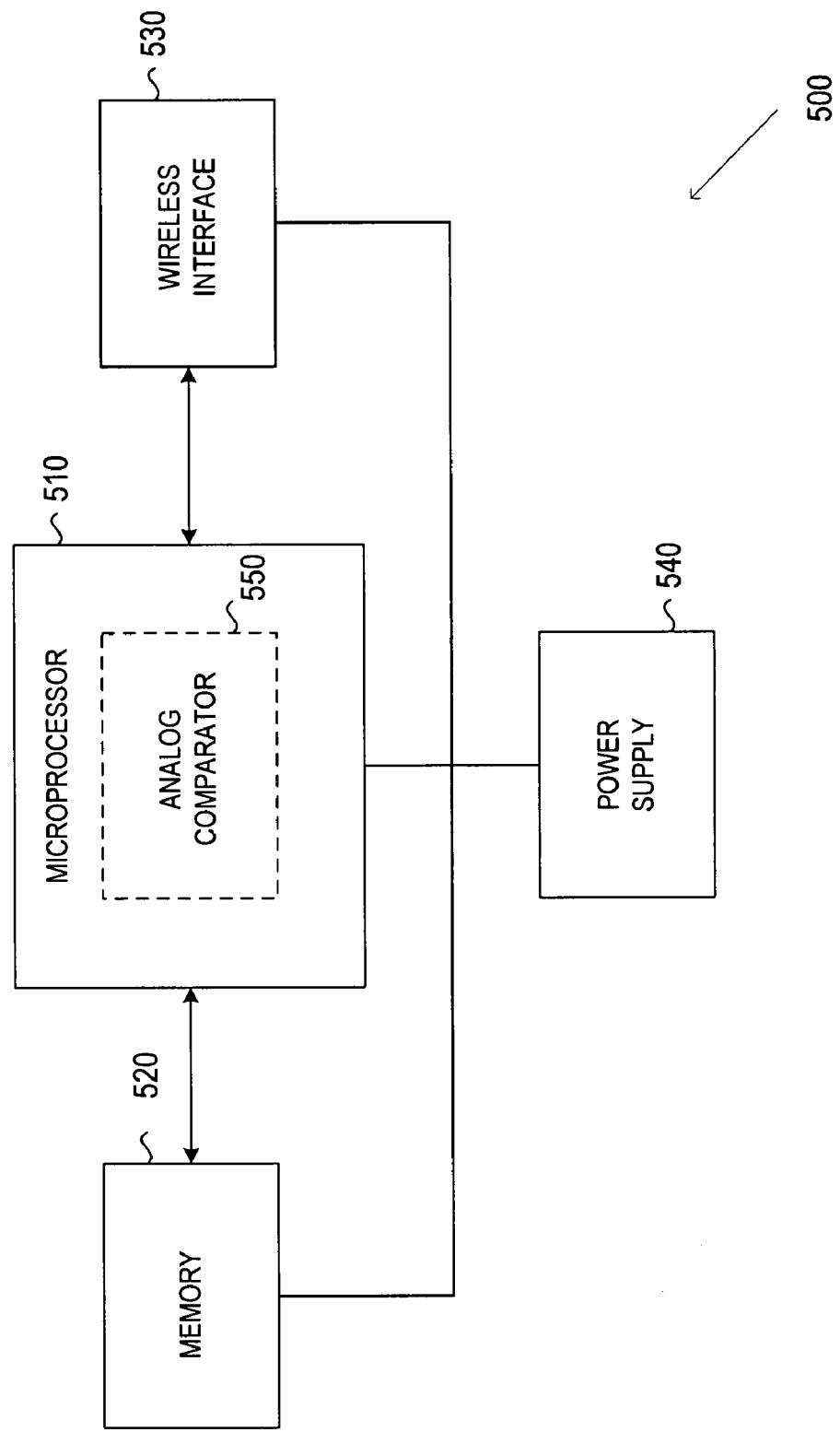
FIG. 5 illustrates an example system utilizing an analog comparator with precise threshold control, according to one embodiment.

FIG. 5 illustrates a wireless system 500 that includes a microprocessor 510 to control the system, memory 520 to store date, a wireless interface 530 to provide wireless communications and a power supply 540 to provide power to the other components. The microprocessor 510 may implement an analog comparator with precise threshold control 550.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
   a reference generator to receive differential input signals and to generate reference voltages having same common mode as the differential input signals, wherein the reference generator includes a current source to generate a current utilized to generate the reference voltages, and wherein the reference voltages are dependent on band gap voltage of the current source;
   a replica bias generator to generate a bias signal based on the reference voltages, wherein the replica bias generator includes a replica comparator to compare the reference voltages to threshold voltages, wherein the threshold voltages are based on the reference voltages; and
   a comparator to compare the differential input signals to biased threshold voltages and generate output signals when the differential inputs signals cross the biased threshold voltages, wherein the biased threshold voltages were biased based on the bias signal.

2. The apparatus of claim 1, wherein the reference generator further includes a common mode feedback loop to generate a common mode voltage for the differential input signals, to generate a common mode voltage for the reference voltages, to compare the generated common mode voltages and set the common mode of the reference voltages equal to the common mode of the differential input signals, wherein the current source generates the current based on the common mode of the reference voltages.

3. The apparatus of claim 1, wherein the reference voltages are substantially immune to PVT variations.

4. The apparatus of claim 1, wherein the threshold voltages for the replica comparator are substantially immune to PVT variations.

5. The apparatus of claim 1, wherein the replica bias generator further includes an operational-transconductance-amplifier to generate the bias signal based on replica comparator output.

6. The apparatus of claim 5, wherein the operational-transconductance-amplifier is to substantially eliminate non reference voltage parameters from threshold voltages for the replica comparator.

7. The apparatus of claim 1, wherein the comparator is to generate a high output signal when a high threshold voltage is exceeded and is to generate a low output signal when a low threshold voltage is exceeded.

8. An analog comparator, in combination with an energy cell to power the analog comparator, to compare differential input signals to biased threshold voltages and to generate output signals when the differential input signals exceed the biased threshold voltages, wherein the biased threshold voltages are substantially immune to PVT variations, the analog comparator comprising
   a reference generator to receive the differential input signals and to generate reference voltages having same common mode as the differential input signals;
   a replica bias generator to generate a bias signal based on the reference voltages; and
   a comparator to generate the biased threshold voltages based on the bias signal, to compare the differential input signals to the biased threshold voltages, and to generate the output signals, wherein a high output signal is generated when a high threshold voltage is exceeded and a low output signal is generated when a low threshold voltage is exceeded.

9. The analog comparator of claim 8, wherein the biased threshold voltages are to be biased based on the reference voltages having same common mode level as the differential input signals.

10. An apparatus comprising
    a reference generator to generate common mode reference voltages, wherein the reference generator includes a current source and a common mode feedback loop, wherein the current source generates a reference current and the reference voltages are generated based on the reference current, wherein the common mode feedback loop receives differential input signals and sets a common mode of the reference voltages equal to a common mode of the differential input signals, and wherein parameters affecting the reference voltages generated are substantially limited to band gap voltage of the current source;
    a bias generator to generate a bias signal based on the reference voltages; and
    a comparator to compare the differential input signals to threshold voltages, and to generate a high output signal when the differential input signals exceed a high threshold voltage and to generate a low output signal when the differential input signals exceed a low threshold voltage, wherein the threshold voltages are based at least in part on the bias signal.

11. The apparatus of claim 10, wherein the bias generator includes a replica comparator to compare the reference voltages to threshold voltages of the replica comparator and a high gain amplifier.

12. The apparatus of claim 11, wherein the high gain amplifier forces the threshold voltages of the replica comparator to be substantially based on the reference voltages.

13. The apparatus of claim 11, wherein parameters affecting the threshold voltages and the bias signal are substantially limited to band gap voltage of the current source.

14. The apparatus of claim 11, wherein the bias signal is provided to the comparator and the replica comparator.

* * * * *